US009620472B2

(12) United States Patent
Otremba et al.

(10) Patent No.: US 9,620,472 B2
(45) Date of Patent: Apr. 11, 2017

(54) METHOD OF MANUFACTURING AN ELECTRONIC COMPONENT

(71) Applicant: Infineon Technologies Austria AG, Villach (AT)

(72) Inventors: Ralf Otremba, Kaufbeuren (DE); Klaus Schiess, Allensbach (DE); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/252,866

(22) Filed: Aug. 31, 2016

(65) Prior Publication Data

US 2016/0372439 A1 Dec. 22, 2016

Related U.S. Application Data

(62) Division of application No. 13/963,461, filed on Aug. 9, 2013, now Pat. No. 9,443,787.

(51) Int. Cl.
*H01L 21/00* (2006.01)
*H01L 23/00* (2006.01)
(Continued)

(52) U.S. Cl.
CPC .......... *H01L 24/40* (2013.01); *H01L 21/4825* (2013.01); *H01L 23/49513* (2013.01);
(Continued)

(58) Field of Classification Search
USPC ................................. 438/107, 110
See application file for complete search history.

(56) References Cited

U.S. PATENT DOCUMENTS 5,759,049 A 6/1998 Gerber
6,157,049 A 12/2000 Mitlehner et al.
(Continued)

FOREIGN PATENT DOCUMENTS

CN 101124678 A 2/2008
CN 102386185 A 3/2012
(Continued)

OTHER PUBLICATIONS

Liu, Zhengyang et al., "Investigation of Package Influence on High Voltage Cascode GaN HEMT with Simulation Model", Feb. 13, 2013, Center for Power Electronics Systems, Milpitas, CA, pp. 1-35.

*Primary Examiner* — Telly Green
(74) *Attorney, Agent, or Firm* — Murphy, Bilak & Homiller, PLLC

(57) ABSTRACT

A method of manufacturing an electronic component includes applying solder paste to at least one electrically conductive portion of a package, applying a high-voltage depletion-mode transistor onto the solder paste, applying a low-voltage enhancement-mode transistor onto the solder paste, applying solder paste onto the high-voltage depletion-mode transistor, applying solder paste onto the low-voltage enhancement-mode transistor, applying an electrically conductive member onto the solder paste on the high-voltage depletion-mode transistor and onto the solder paste on the low-voltage enhancement-mode transistor to form an assembly, and heat treating the assembly to produce an electrical connection between the high-voltage depletion-mode transistor and the low-voltage enhancement-mode transistor via the electrically conductive member.

6 Claims, 10 Drawing Sheets

(51) Int. Cl.
    *H01L 23/495* (2006.01)
    *H01L 21/48* (2006.01)

(52) U.S. Cl.
    CPC .. *H01L 23/49562* (2013.01); *H01L 23/49568* (2013.01); *H01L 23/49575* (2013.01); *H01L 2224/40137* (2013.01); H01L 2924/1033 (2013.01); *H01L 2924/10253* (2013.01); *H01L 2924/10272* (2013.01); H01L 2924/13064 (2013.01); H01L 2924/13091 (2013.01); H01L 2924/30107 (2013.01)

(56) References Cited

U.S. PATENT DOCUMENTS

| | | |
|---|---|---|
| 7,884,394 B2 | 2/2011 | Wu et al. |
| 7,965,126 B2 | 6/2011 | Honea et al. |
| 8,319,548 B2 | 11/2012 | Ramaraju et al. |
| 8,508,281 B2 | 8/2013 | Honea et al. |
| 8,624,662 B2 | 1/2014 | Parikh et al. |
| 8,648,643 B2 | 2/2014 | Wu |
| 8,912,839 B2 | 12/2014 | Honea et al. |
| 9,006,870 B2 | 4/2015 | Zhang et al. |
| 2004/0212057 A1 | 10/2004 | Otremba |
| 2007/0066336 A1 | 3/2007 | Merboth et al. |
| 2007/0145573 A1 | 6/2007 | Otremba |
| 2007/0145582 A1 | 6/2007 | Otremba |
| 2007/0215980 A1 | 9/2007 | Otremba |
| 2007/0215996 A1 | 9/2007 | Otremba |
| 2007/0222044 A1 | 9/2007 | Otremba |
| 2007/0259514 A1 | 11/2007 | Otremba |
| 2007/0262346 A1 | 11/2007 | Otremba et al. |
| 2007/0266588 A1 | 11/2007 | Maniha |
| 2007/0267729 A1 | 11/2007 | Otremba |
| 2007/0290337 A1 | 12/2007 | Otremba et al. |
| 2008/0024300 A1 | 1/2008 | Fawcett et al. |
| 2008/0073773 A1 | 3/2008 | Huber et al. |
| 2008/0197463 A1 | 8/2008 | Otremba |
| 2009/0201072 A1 | 8/2009 | Honea et al. |
| 2010/0201439 A1 | 8/2010 | Wu et al. |
| 2011/0049580 A1 | 3/2011 | Lui et al. |
| 2011/0193619 A1 | 8/2011 | Parikh et al. |
| 2011/0249477 A1 | 10/2011 | Honea et al. |
| 2012/0235227 A1 | 9/2012 | Otremba et al. |
| 2012/0256188 A1 | 10/2012 | McDonald et al. |
| 2013/0009295 A1 | 1/2013 | Otremba |
| 2013/0009613 A1 | 1/2013 | Honea et al. |
| 2013/0113114 A1 | 5/2013 | Hosseini et al. |
| 2013/0127113 A1 | 5/2013 | Davenport et al. |
| 2013/0200532 A1 | 8/2013 | Otremba et al. |
| 2013/0222045 A1 | 8/2013 | Wu |
| 2013/0249622 A1 | 9/2013 | Honea et al. |
| 2013/0256856 A1 | 10/2013 | Mahler et al. |
| 2014/0015066 A1 | 1/2014 | Wu et al. |
| 2014/0021934 A1 | 1/2014 | Wu et al. |
| 2014/0042495 A1 | 2/2014 | Parikh et al. |
| 2014/0264431 A1 | 9/2014 | Lal |

FOREIGN PATENT DOCUMENTS

| | | |
|---|---|---|
| CN | 102696106 A | 9/2012 |
| DE | 19610135 C1 | 6/1997 |
| DE | 102005034012 A1 | 11/2006 |
| WO | 2011097302 A2 | 8/2011 |

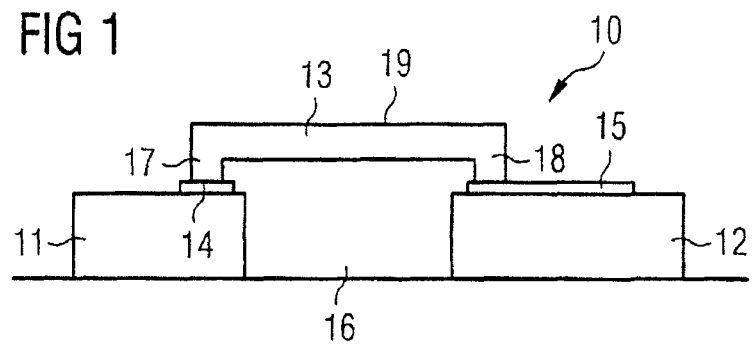
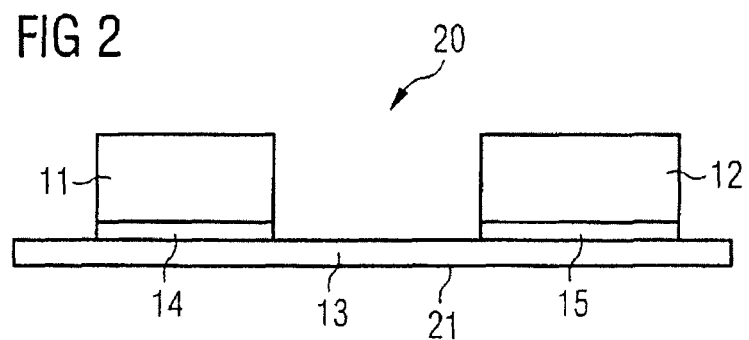
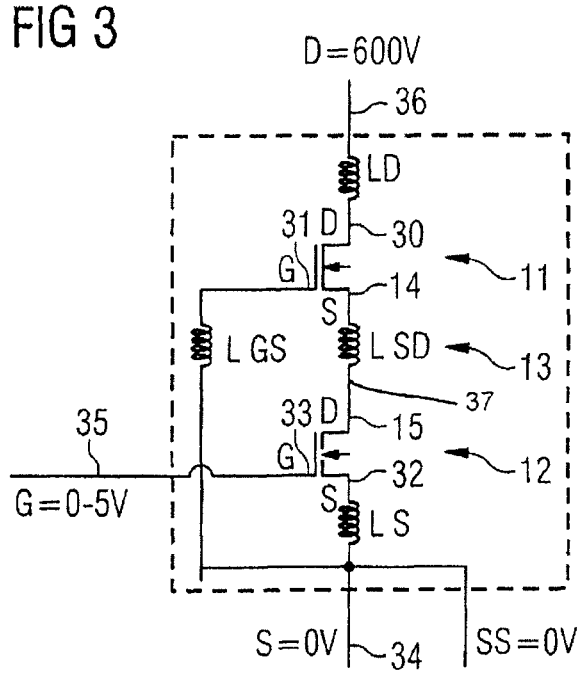

METHOD OF MANUFACTURING AN ELECTRONIC COMPONENT

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

An electronic component includes a high-voltage depletion-mode transistor, a low-voltage enhancement-mode transistor, the low-voltage enhancement-mode transistor being arranged adjacent and spaced apart from the high-voltage depletion-mode transistor and an electrically conductive member electrically connecting a first current electrode of the high-voltage depletion-mode transistor to a first current electrode of the low-voltage enhancement-mode transistor, the electrically conductive member having a sheet-like form.

A method includes applying solder paste to at least one electrically conductive portion of a package, applying a high-voltage depletion-mode transistor onto the solder paste, applying a low-voltage enhancement-mode transistor onto the solder paste, applying solder paste onto the high-voltage depletion-mode transistor, applying solder paste onto the low-voltage enhancement-mode transistor, applying an electrically conductive member onto the solder paste on the high-voltage depletion-mode transistor and onto the low-voltage enhancement-mode transistor and forming an assembly, heat treating the assembly and producing an electrical connection between the high-voltage depletion-mode transistor and the low-voltage enhancement-mode transistor with the electrically conductive member.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates an electronic component.

FIG. 2 illustrates an electronic component.

FIG. 3 illustrates a schematic diagram of an electronic component including a cascode circuit.

DETAILED DESCRIPTION

Figure 4:
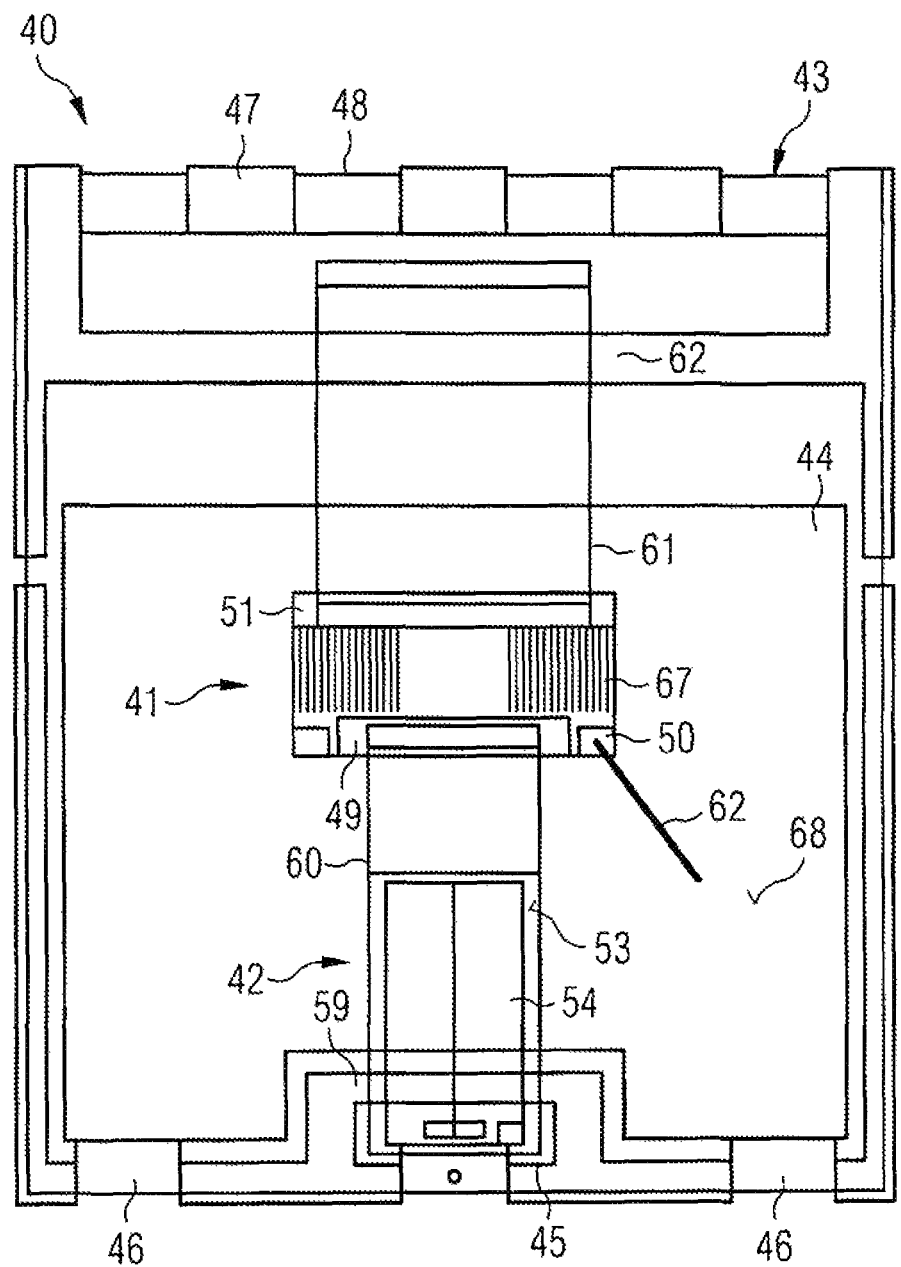
FIG. 4 illustrates an electronic component providing a cascode circuit.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates an electronic component 10 according to an embodiment including a high-voltage depletion-mode transistor 11 and a low-voltage enhancement-mode transistor 12. The low-voltage enhancement-mode transistor 12 is arranged adjacent and spaced apart from the high-voltage depletion-mode transistor 11. The electronic component 10 further includes an electrically conductive member 13 which is electrically coupled to a first current electrode 14 of the high-voltage depletion-mode transistor 11 and to a first current electrode 15 of the low-voltage enhancement-mode transistor 12. The electrically conductive member 13 has a sheet-like form.

A sheet-like form is used to denote an electrically conductive member which is thin in comparison to its length and breadth. In an embodiment, the electrically conductive member has a thickness t, a breadth b and a length l and $t \leq 10b$ and $\leq 10l$. The sheet-like form of the electrically conductive member may be used to provide an electrically conductive member with an inductance of less than 1 nH.

The high-voltage depletion-mode transistor 11 may be a Group III-nitride transistor, such as a Group III nitride HEMT, or a silicon carbide transistor. The low-voltage enhancement-mode transistor 12 may be a field effect transistor, for example a silicon-based transistor, such as a MOSFET. The high-voltage depletion-mode transistor 11 may be a field-effect transistor (FET), such as a high-electron mobility transistor (HEMT), a hetero-junction field-effect transistor (HFET), a JFET, a MESFET, a CAVET, or any other FET structure suitable for power switching applications.

The high-voltage depletion-mode transistor 11 may be a lateral device and the low-voltage enhancement-mode transistor 12 may have a vertical drift path and be denoted as a vertical device. The high-voltage depletion-mode transistor 11 and the low-voltage enhancement-mode transistor 12 may be based on different semiconductor materials. For example, the high-voltage depletion-mode transistor 11 may be based on SiC or a Group III-nitride such as gallium nitride and the low-voltage enhancement-mode transistor 12 may be based on silicon.

The high-voltage depletion-mode transistor 11 and the low-voltage enhancement-mode transistor 12 have a side-by-side arrangement and are spaced at a distance from one another so that there is a gap 16 between them. The electrically conductive member 13 extends between the first current electrode 14 of the high-voltage depletion-mode transistor 11 and the first current electrode 15 of the low-voltage enhancement-mode transistor 12. The high-voltage depletion-mode transistor 11 and the low-voltage enhancement-mode transistor 12 may be arranged in a common lateral plane or in lateral planes which lie parallel to one another.

The electrically conductive member 13 may bridge the gap 16 between the first current electrode 14 of the high-voltage depletion-mode transistor 11 and the first current electrode 15 of the low-voltage enhancement-mode transistor 12. The electrically conductive member 13 may provide a node of a cascode circuit or a half-bridge circuit. A package may enclose both the high-voltage depletion-mode transistor 11 and the low-voltage enhancement-mode transistor 12. The electrically conductive member 13 may be provided in the form of a contact clip or a die pad, for example, the die pad of a leadframe of a package. The package may have a standard outline, such as a SuperSO8-package outline.

In the embodiment of FIG. 1, the electrically conductive member 13 is illustrated as a contact clip. The contact clip may include electrically conductive material such as a metal or alloy, for example copper. The clip has the form of a foil or thin plate which may be formed to have contact portions 17, 18 which protrude from a central raised region 19 which may be generally planar. The contact portions 17, 18 may be electrically coupled to the respective current electrode 14, 15 by solder, for example a soft solder.

In an embodiment, the high-voltage depletion-mode transistor 11 is a gallium nitride-based HEMT and the first current electrode 14 of the high-voltage depletion-mode transistor 11 is a source electrode. In this embodiment, the low-voltage enhancement-mode transistor 12 is MOSFET device, in particular, an n-type MOSFET, and the first current electrode 15 of the low-voltage enhancement-mode transistor 12 is a drain electrode.

FIG. 2 illustrates an electronic component 20 according to an embodiment which includes a high-voltage depletion-mode transistor 11, a low-voltage enhancement-mode transistor 12 and an electrically conductive member 13 which is electrically coupled to a first current electrode 14 of the high-voltage depletion-mode transistor 11 and to a first current electrode 15 of a low-voltage enhancement-mode transistor and which has a sheet-like form as in the embodiment illustrated in FIG. 1. The low-voltage enhancement-mode transistor 12 is arranged adjacent and spaced apart from the high-voltage depletion-mode transistor 11 in a side-by-side arrangement. In the embodiment illustrated in FIG. 2, the electrically conductive member 13 is provided by a die pad 21.

The die pad 21 may be part of an arrangement including two or more leads which are arranged adjacent to and spaced apart from the die pad 21. The die pad 21 may provide a structural portion of a package, for example. The die pad and leads, if present, includes an electrically conductive material, for example a metal or an alloy, such as copper.

The arrangement of the low-voltage enhancement-mode transistor 12 and the high-voltage depletion-mode transistor 11 adjacent one another may be used to improve the thermal dissipation of heat generated by the two transistors as mutual heating between the two transistors is reduced over an arrangement in which one transistor is stacked directly upon the other.

The two-dimensional generally sheet-like or plate-like shape of the electrically conductive member 13, such as a contact clip or a die pad, may be used to reduce the inductance of the node between the two transistors over an arrangement using a bond wire. In addition to the node having an inductance of less than 1 nH, the entire package may have an inductance of less than 1 nH.

In embodiments in which the low-voltage enhancement-mode transistor 12 and the high-voltage depletion-mode transistor 11 are mounted adjacent one another on a common die pad, heat dissipation may also be assisted by the die pad, as the die pad may also act as a form of heat sink.

As discussed above, in an embodiment, the electrically conductive member 13 provides a node of a cascode circuit. A cascode circuit is illustrated in FIG. 3. In the cascode circuit, a high-voltage depletion-mode transistor 11, which is normally on, is combined with the low-voltage enhancement-mode transistor 12, which is normally off, to form a hybrid device in which the low-voltage enhancement-mode transistor is used to drive the gate of the high-voltage depletion-mode transistor and produce a hybrid device which is normally off.

FIG. 3 illustrates an example of the cascode circuit including a high-voltage depletion-mode transistor 11 and a low-voltage enhancement-mode transistor 12 and an electrically conductive member 13.

The high-voltage depletion-mode transistor 11 includes, in addition to the first current electrode 14, a second current electrode 30 and a control electrode 31. The first current electrode 14 may be a source electrode, the second current electrode 30 may be a drain electrode and the control electrode 31 may be a gate electrode.

The low-voltage enhancement-mode transistor 12 includes, in addition to the first current electrode 15, a second current electrode 32 and a control electrode 33. The first current electrode 15 may be a drain electrode, the second current electrode 32 may be a source electrode and the control electrode 33 may be a gate electrode.

The first current electrode 14, in this arrangement the source electrode, of the high-voltage depletion-mode transistor 11 is electrically connected to the first current electrode 15, in this arrangement, the drain electrode of the low-voltage enhancement-mode transistor 12 by the electrically conductive member 13 and provides a node 37. The gate electrode 31 of the high-voltage depletion-mode transistor 11 is electrically coupled with the source electrode 32 of the low-voltage enhancement-mode transistor 12.

The high-voltage depletion-mode transistor 11 and the low-voltage enhancement-mode transistor 12 may be encased in a single package, illustrated schematically in FIG. 3 with a dotted line, the package including a source lead 34, a gate lead 35 and a drain lead 36. The source lead 34 may be denoted as a low-voltage lead and the drain lead 36 may be denoted as a high-voltage lead. In the example illustrated in FIG. 3, 0 V may be applied to the low-voltage lead 34 and 600 V to the high-voltage lead 36.

The source electrode 32 of the low-voltage enhancement-mode transistor 12 and the gate electrode 31 of the high-voltage depletion-mode transistor 11 are both electrically coupled to the source lead 34. The gate electrode 33 of the low-voltage enhancement-mode transistor 12 is electrically coupled to the gate lead 35. The drain electrode 30 of the high-voltage depletion-mode transistor 12 is electrically coupled to the drain lead 36.

Figure 5:
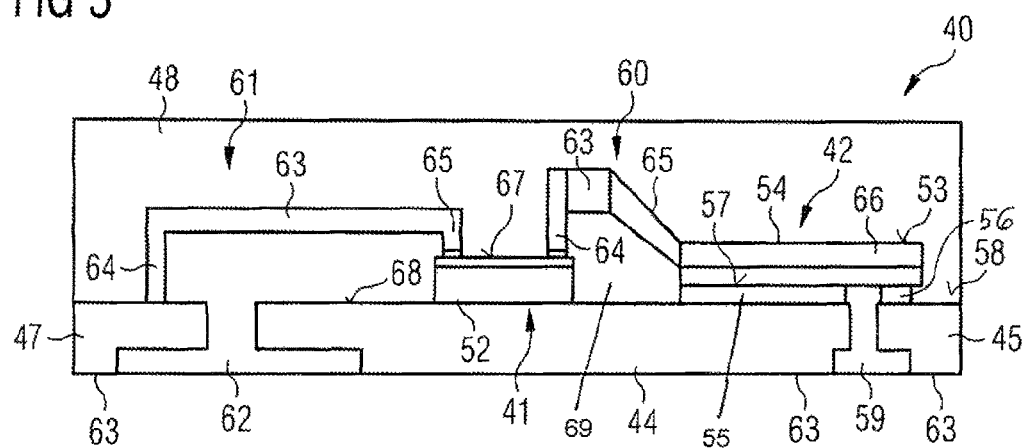
FIG. 5 illustrates a cross-sectional view of an electronic component providing a cascode circuit.

FIG. 4 illustrates a plan view and FIG. 5 illustrates a cross-sectional view of an electronic component 40 according to an embodiment, the electronic component 40 including a high-voltage depletion-mode transistor 41 and a low-voltage enhancement-mode transistor 42 arranged in a single package 43. The single package 43 includes a die pad 44, a gate lead 45, a source lead 46, a drain lead 47, and a housing 48 including non-electrically conductive material such as an epoxy resin. The source lead 46 is integral with, and extends from, the die pad 44. The gate lead 45 and the drain lead 47 are arranged spaced at a distance from the die pad 44.

The drain lead 47 is positioned adjacent one side of the die pad 44 and the source lead 46 and gate lead 45 are positioned adjacent the opposing side of the die pad 44. The single package 43 may have a standard outline, such as a SO8-package outline.

The high-voltage depletion-mode transistor 41 includes an upper side 67 including a source electrode 49, gate electrode 50 and drain electrode 51, and a lower side 52 which faces towards and is mounted on the upper surface 68 of the die pad 44. The high-voltage depletion-mode transistor 41 is electrically insulated from the die pad 44.

The low-voltage enhancement-mode transistor 42 includes an upper side 53 including a drain electrode 54 and a lower side 57 including a source electrode 55 and gate electrode 56. The source electrode 55 faces the upper surface 68 of the die pad 44 and is mounted on, and electrically coupled to, the upper surface 68 of the die pad 44 by solder. The low-voltage enhancement-mode transistor 42 is arranged adjacent to, and spaced apart from, the high-voltage depletion-mode transistor 41. The gate electrode 56 faces towards the upper surface 58 of the gate lead 45 and is mounted on the upper surface 58 of the gate lead 45 by solder. The high-voltage depletion-mode transistor 11 extends between the die pad 44 and the gate lead 45 and bridges a gap 59 between the gate lead 45 and the die pad 44.

The drain electrode 54 of the low-voltage enhancement-mode transistor 42 is electrically connected to the source electrode 49 of the low-voltage enhancement-mode transistor 41 by an electrically conductive member in the form of a contact clip 60 which extends between the source electrode 49 and drain electrode 54 and bridges the gap 69 between the high-voltage depletion-mode transistor 41 and the low-voltage enhancement-mode transistor 42. The drain electrode 51 of the high-voltage depletion-mode transistor 41 is electrically coupled to the drain lead 47 by a second electrically conductive member in the form of a second contact clip 61 which extends between the drain electrode 51 and the drain lead 47 and bridges a gap 62 between the die pad 44 and the drain lead 47.

The electrically conductive member 60 provides the node 37 of the cascode circuit illustrated in FIG. 4. The electrically conductive member 60 has a low inductance due to its large cross-sectional area and plate-like form. The inductance of the electronic component 40 may also be held low, if the second contact clip 61 has a plate-like shape. The gate electrode 50 of the high-voltage depletion-mode transistor 41 is electrically coupled with the source electrode 55 of the low-voltage enhancement-mode transistor 42 by means of a bond wire 62 which extends between the gate electrode 50 and the die pad 44.

Material providing the housing 48 encapsulates the transistor devices 41, 42, the two contact clips 60, 61, the bond wire 62 and at least the upper surfaces of the leads 45, 46, 47 and the die pad 44. In the cross-sectional view of FIG. 5, it can be seen that the electronic component 40 includes a package 43 with surface mountable lands 63 provided by the lower surface of the drain lead 47, the gate lead 45 and the die pad 44 which provide a coplanar lower surface for mounting the electronic component 40 on a circuit board.

As is illustrated in the cross-sectional view of FIG. 5, the contact clips 60, 61 each have a raised portion 63 and two leg portions 64 and 65 protruding towards the respective electrodes. In the case of the contact clip 60, the protruding portion 65 has a flange region 66 with a lateral extent such that it covers the entire rear surface of the low-voltage enhancement-mode transistor 41 and the entire lateral extent of the drain electrode 54. This arrangement may assist in reducing the contact resistance between the contact clip 60 and drain electrode 54.

Figure 6:
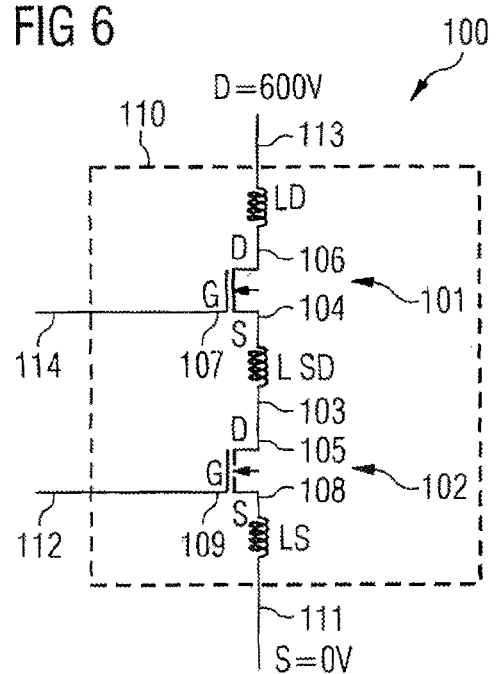
FIG. 6 illustrates a schematic view of an electronic component including a half-bridge circuit.

As discussed above, the electronic component illustrated in FIG. 1 may be used to provide a half-bridge circuit. FIG. 6 illustrates an electronic component 100 providing a half-bridge circuit which includes a high-voltage depletion-mode transistor 101, a low-voltage enhancement-mode transistor 102 and an electrically conductive member 103 which electrically couples a first current electrode 104 which, in this example is the source electrode, to a first current electrode 105 of the low-voltage enhancement-mode transistor 102, which in this embodiment is a drain electrode.

The high-voltage depletion-mode transistor 101 includes, in addition to the first current electrode 104, a second current electrode 106 and a control electrode 107. The first current electrode 104 may be a source electrode, the second current electrode 106 may be a drain electrode and the control electrode 107 may be a gate electrode.

The low-voltage enhancement-mode transistor 102 includes, in addition to the first current electrode 105, a second current electrode 108 and a control electrode 109. The first current electrode 105 may be a drain electrode, the second current electrode 108 may be a source electrode and the control electrode 109 may be a gate electrode.

The high-voltage depletion-mode transistor 101 and the low-voltage enhancement-mode transistor 102 may be encased in a single package 110, the package including a source lead 111, gate leads 112, 114 and a drain lead 113. The source lead 111 may be denoted as a low-voltage lead and the drain lead 113 may be denoted as a high-voltage lead. In the example illustrated in FIG. 6, 0 V may be applied to the low-voltage lead and 600 V to the high-voltage lead.

The source electrode 105 of the low-voltage enhancement-mode transistor 102 is coupled to the source lead 111. The gate electrode 109 of the low-voltage enhancement-mode transistor 102 is electrically coupled to the gate lead 112. The drain electrode 106 of the high-voltage depletion-mode transistor 101 is electrically coupled to the drain lead 113.

The arrangement differs from that of the cascode circuit illustrated in FIG. 3 by the electrical connection to the gate electrode 107 of the high-voltage depletion-mode transistor 101. In this embodiment, the gate electrode 107 of the high-voltage depletion-mode transistor 101 is electrically coupled to a second gate lead 114 of the package 110 and may be directly controlled by use of the second gate lead 114.

Figure 7:
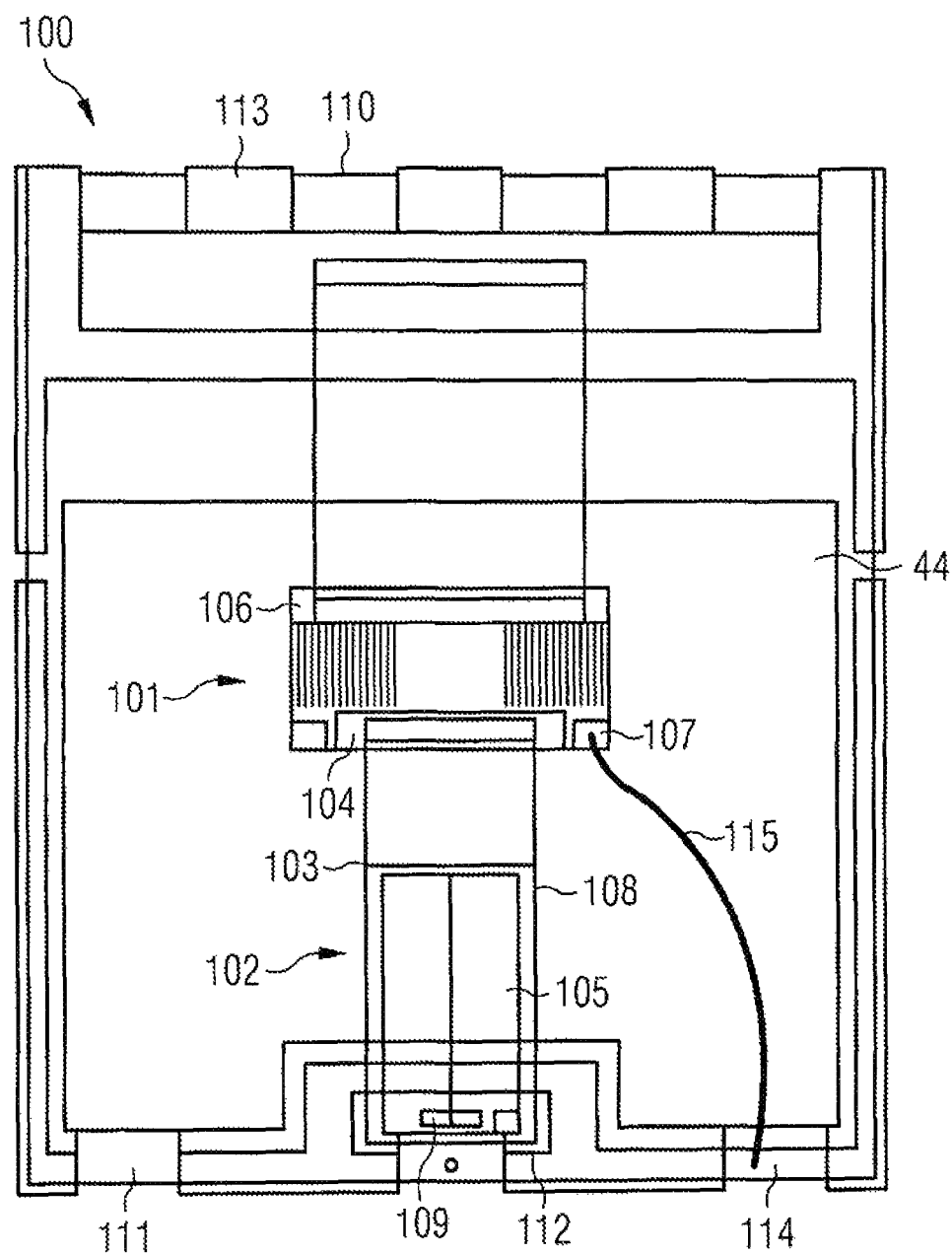
FIG. 7 illustrates an electronic component providing a half-bridge circuit.

FIG. 7 illustrates a top view of an electronic component 100 according to an embodiment. The arrangement differs from that for the cascode circuit illustrated in FIG. 4 by the arrangement of a bond wire 115 coupled to the gate electrode 107 of the high-voltage depletion-mode transistor 101. The bond wire 115 extends between the gate electrode 107 and the second gate lead 114 of the package 110 which is spaced at a distance from the die pad 44.

Figure 8:
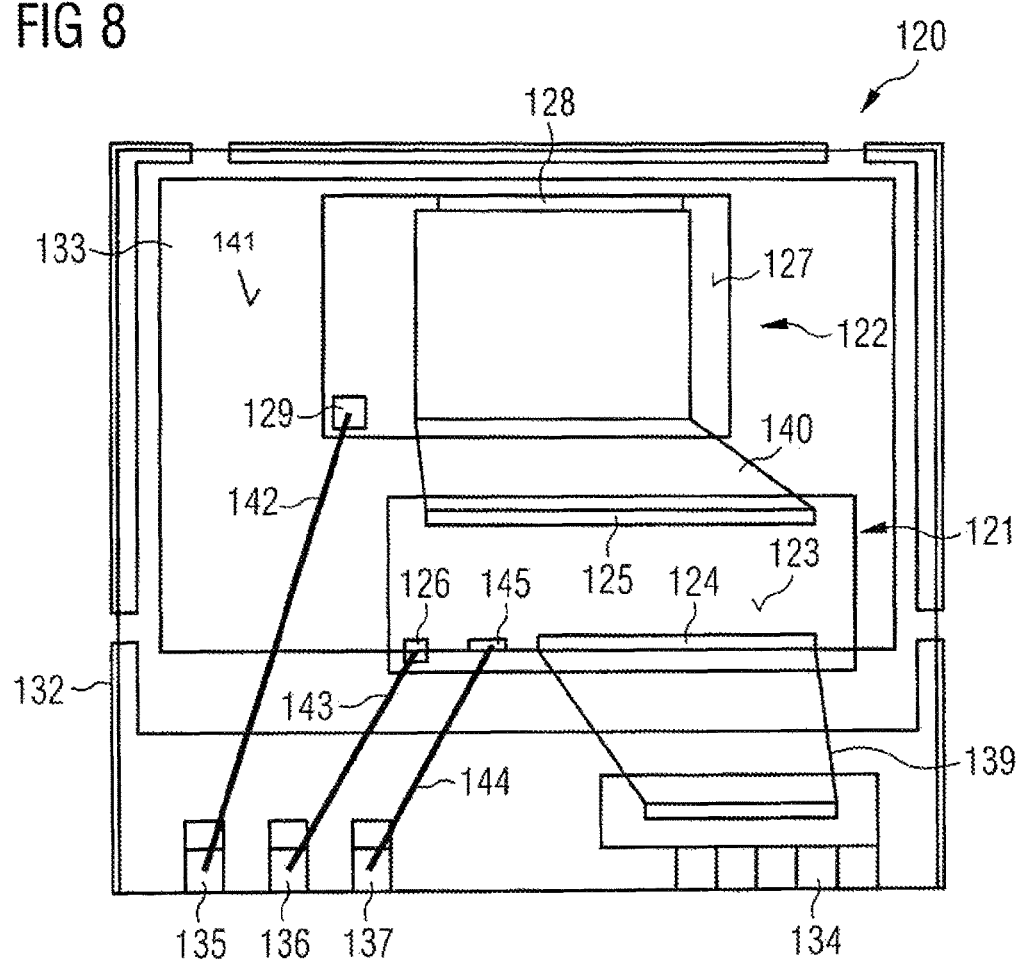
FIG. 8 illustrates an electronic component providing a half-bridge circuit.
Figure 9:
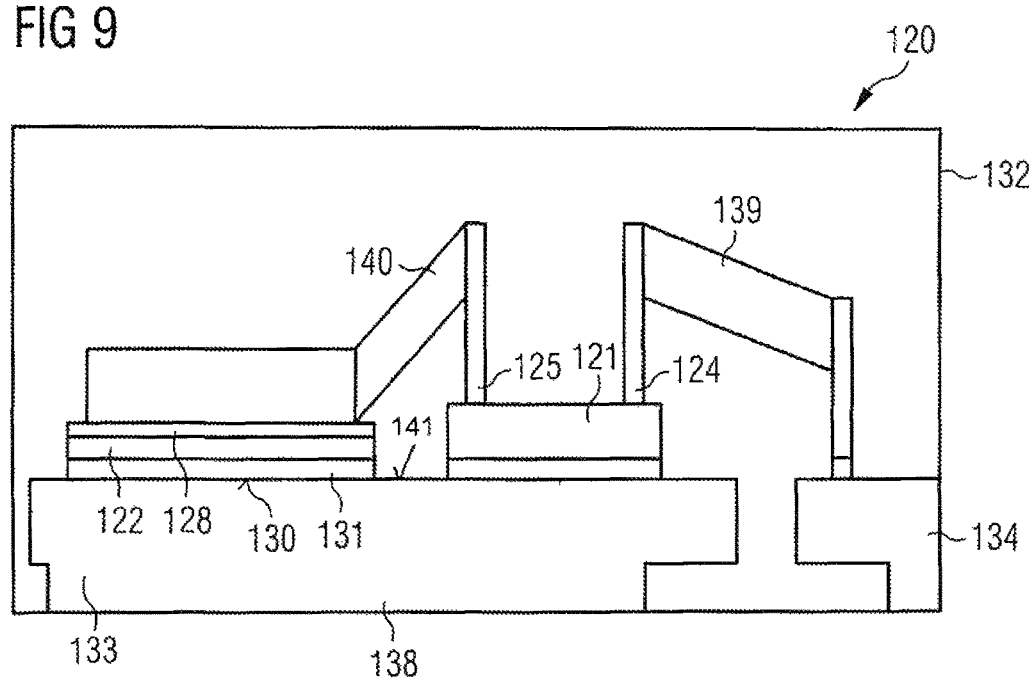
FIG. 9 illustrates a cross-sectional view of an electronic component providing a half-bridge circuit.

FIG. 8 illustrates a top view and FIG. 9 illustrates a cross-sectional view of an electronic component 120 according to an embodiment which provides a half-bridge circuit. The electronic component 120 includes a high-voltage depletion-mode transistor in the form of a gallium nitride-based HEMT 121 and a low-voltage enhancement-mode transistor in the form of a p-type MOSFET device 122. The gallium nitride-based HEMT 121 includes an upper surface 123 including a drain electrode 124, a source electrode 125 and a gate electrode 126. The p-type MOSFET device 122 has an upper surface 127 including a source electrode 128 and a gate electrode 129. The opposing rear surface 130 of the p-type MOSFET device 122 includes a drain electrode 131.

The electronic component 120 includes a package 132 including a die pad 133, a drain lead 134, a first gate lead 135, a second gate lead 136 and a sense lead 137 and spaced at a distance from the die pad 133 adjacent one side of the die pad 133. The lower surface 138 of the die pad 133 remains exposed from the package and provides the low-voltage lead of the half-bridge circuit.

The drain electrode 131 of the p-type MOSFET is mounted on the upper surface 141 of the die pad 133 by a solder layer so that it is electrically coupled with the die pad 133. The gallium nitride-based HEMT 121 is also mounted on the upper surface 141 of the die pad 133 and is electrically insulated from the die pad 133 by an electrically insulating substrate of the gallium nitride-based HEMT 121.

The drain electrode 124 of the gallium nitride-based HEMT 121 is electrically coupled to the drain lead 134 by a first contact clip 139. The source electrode 125 of the gallium nitride-based HEMT 121 is connected to the source electrode 128 of the p-type MOSFET device 122 by a second contact clip 140. The gate electrode 129 of the p-type MOSFET device 122 is electrically connected to the first gate lead 135 by a bond wire 142. The gate electrode 126 of the gallium nitride-based HEMT 121 is electrically coupled to the second gate lead 136 by a bond wire 143. A further bond wire 144 is provided to couple a sensing circuit 145 of the gallium nitride-based HEMT 121 to the sense lead 137.

Since the low-voltage enhancement-mode transistor is a p-type device, the source electrode provides the high side and the drain electrode provides the low side. Therefore, the physical arrangement of the low-voltage enhancement-mode transistor is reversed compared to that of FIG. 4, for example, in that the source electrode 128 faces away from the die pad 133 and the drain electrode 131 faces towards, and is mounted on, the die pad 133.

Figure 10:
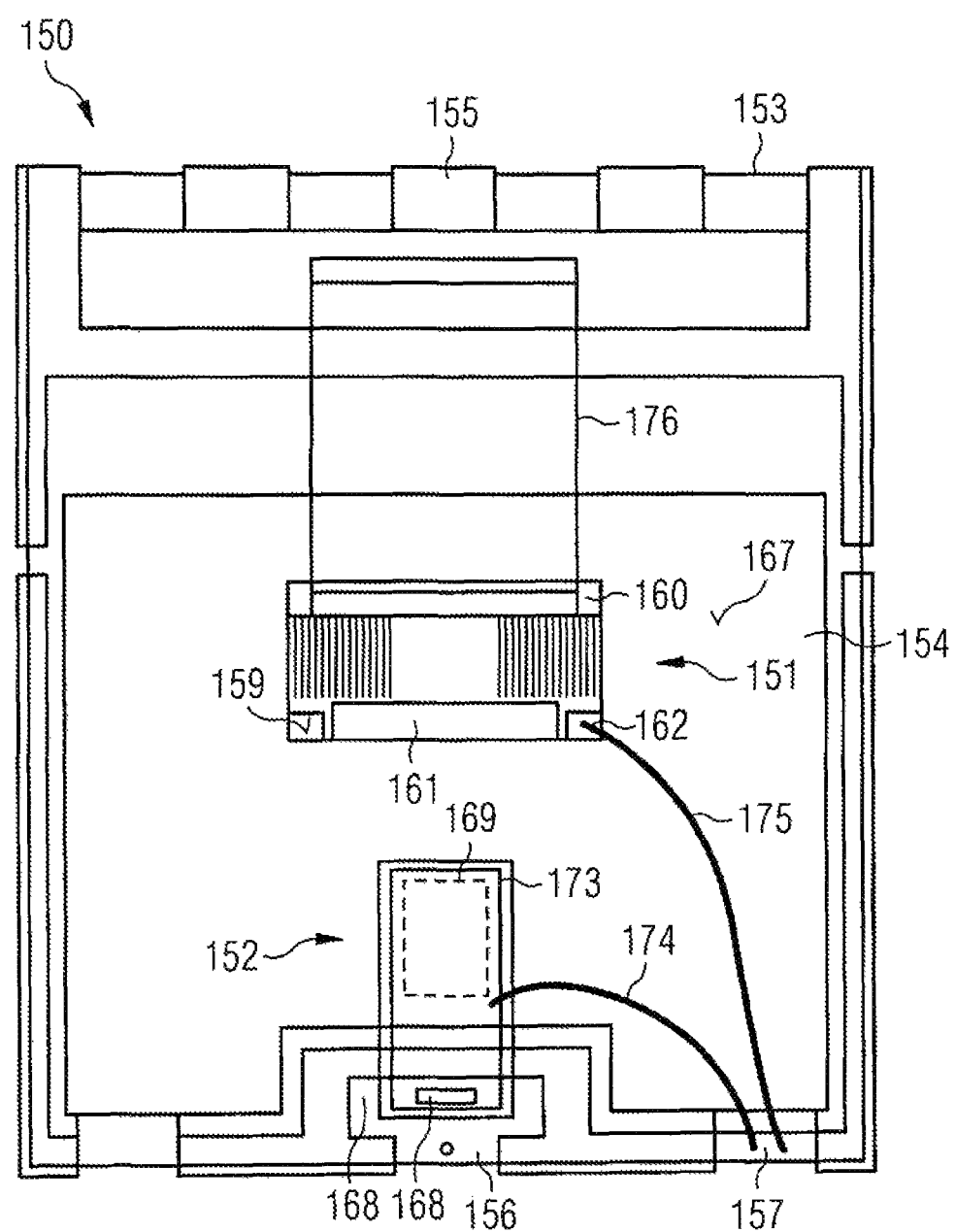
FIG. 10 illustrates an electronic component providing a cascode circuit.
Figure 11:
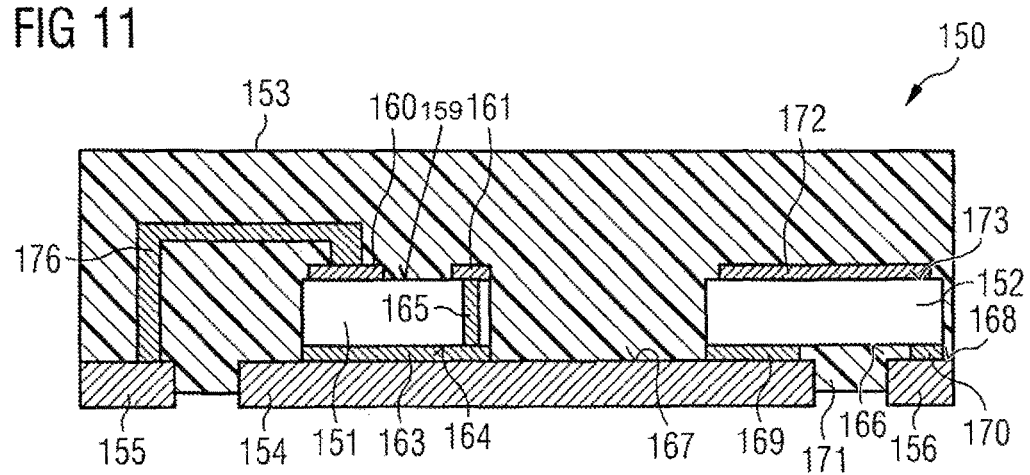
FIG. 11 illustrates a cross-sectional view of an electronic component providing a cascode circuit.

In the embodiment illustrated in FIG. 2, the node between the high-voltage depletion-mode transistor 11 and the low-voltage enhancement-mode transistor 12 is provided by a die pad 21 rather than by a contact clip. FIG. 10 illustrates a plan view and FIG. 11 a cross-sectional view of an electronic component 150 according to an embodiment including this arrangement and providing a cascode circuit.

The electronic component 150 includes a high-voltage depletion-mode device in the form of gallium nitride-based HEMT 151 and a low-voltage enhancement-mode device in the form of a p-type MOSFET device 152 which is arranged adjacent and spaced at a distance from the gallium nitride-based HEMT 151. The p-type MOSFET device 152 and the gallium nitride-based HEMT have a side-by-side arrangement. The electronic component 150 further includes a package 153 including a die pad 154, a drain lead 155, a gate lead 156 and a low-voltage lead 157. The low-voltage lead 157 provides the low-voltage lead of the cascode circuit and the drain lead 155 provides the high-voltage lead of the cascode circuit. The drain lead 155, the gate lead 156 and the low-voltage lead 157 are spaced at a distance from the die pad 154 and are generally coplanar with the die pad 154. The package 153 also includes epoxy resin 158 providing a housing.

The upper surface 159 of the gallium nitride-based HEMT 151 includes a drain electrode 160, a source electrode 161 and a gate electrode 162. As is illustrated in the cross-sectional view of FIG. 11, the source electrode 161 positioned on the upper surface 159 is electrically coupled to a further electrode 163 arranged on the rear surface 164 of the gallium nitride-based HEMT 151 by means of a via 165 extending through the thickness of the gallium nitride-based HEMT 151. The electrode 163 is mounted on, and electrically coupled to, the die pad 154 by a solder layer and electrically couples the source electrode 161 on the upper surface 159 to the die pad 154.

The p-type MOSFET device 152 has a lower side 166 which faces towards an upper surface 167 of the die pad 154 and an upper surface 168 of the gate lead 156. The lower side 166 includes a source electrode 169 and a gate electrode 170. The source electrode 169 is mounted on, and electrically coupled to, the upper surface 167 of the die pad 154 and the gate electrode 170 is mounted on, and electrically coupled to, the upper surface 168 of the gate lead 156. The p-type MOSFET device 152 therefore bridges a gap 171 between the die pad 154 and the gate lead 156. The p-type MOSFET device 152 includes a drain electrode 172 on its upper surface 173. The drain electrode 172 of the p-type MOSFET device is electrically coupled to the low-voltage lead 157 by bond wire 174. The gate electrode 162 of the gallium nitride-based HEMT 151 is also electrically coupled to the low-voltage lead 157 by bond wire 175. The low-voltage lead 157 provides a common connection for the drain electrode 172 of the p-type MOSFET device 152 and the gate electrode 162 of the gallium nitride-based HEMT 151 and a cascode circuit.

The drain electrode 160 of the gallium nitride-based HEMT 151 is electrically connected to the drain lead 155 which provides a high-voltage lead by a contact clip 176. The contact clip 176 may be replaced by a plurality of bond wires.

The die pad 154 electrically couples the source electrode 161 of the gallium nitride-based HEMT 151 to the source electrode 169 of the p-type MOSFET device 152 and provides a node of the cascode circuit.

The die pad 154 has a plate form and therefore provides a low inductance connection between the source electrode 161 of the gallium nitride-based HEMT 151 and the source electrode 169 of the p-type MOSFET 152 in a similar way to the low inductance connection provided by contact clip in the embodiments illustrated in FIGS. 1, 4, 5, 7 and 8.

Figure 12:
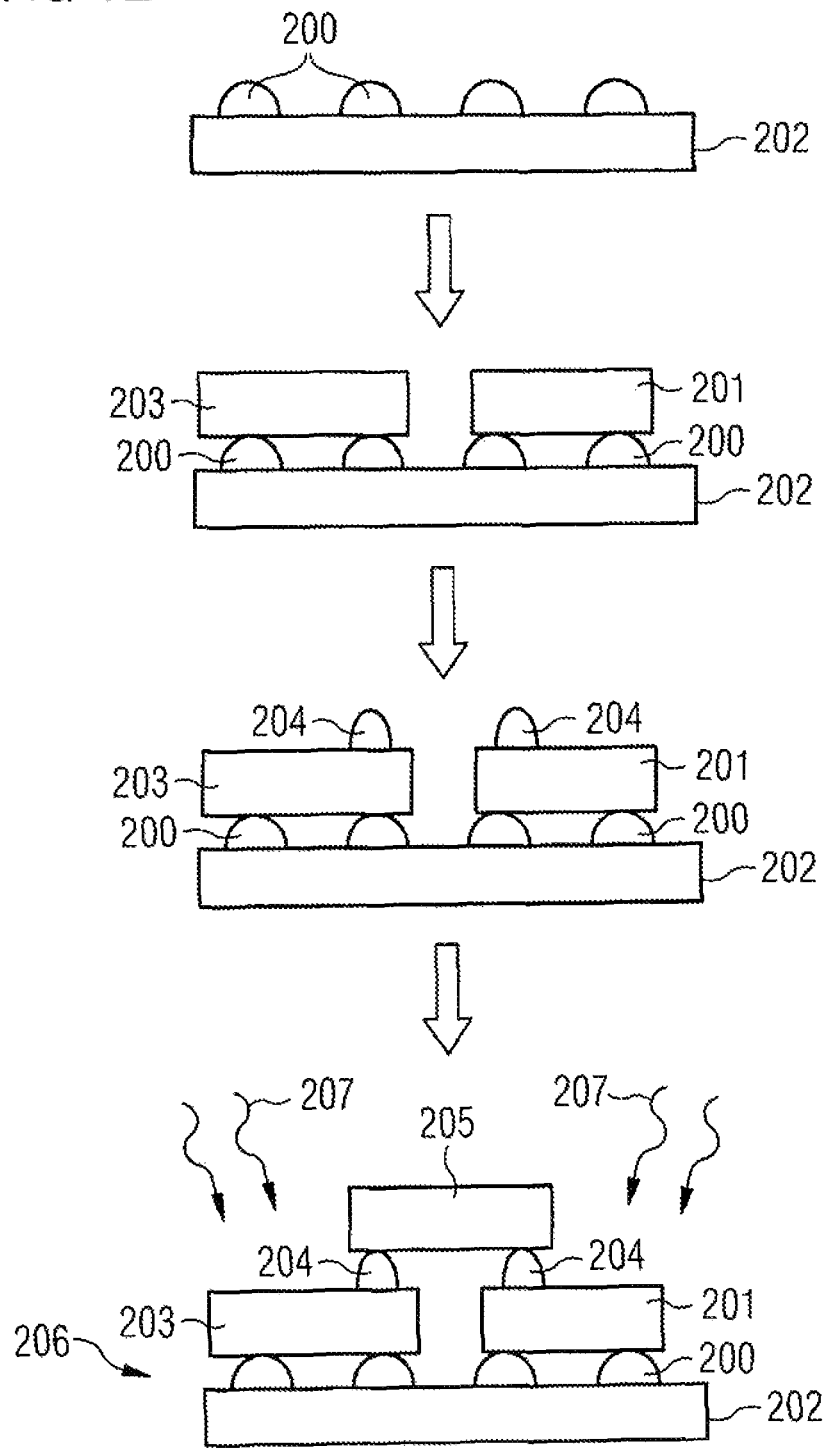
FIG. 12 illustrates a method of manufacturing an electronic component.

FIG. 12 is a schematic illustration of a method in which solder paste 200 is applied to at least one electrically conductive portion of a package, for example to at least one portion of a lead frame 202. A high-voltage depletion-mode transistor 201 is applied onto the solder paste 200 and a low-voltage enhancement-mode transistor 203 is also applied onto the solder paste 200. Solder paste 204 is then applied onto the high-voltage depletion-mode transistor 201 and the low-voltage enhancement-mode transistor 203. An electrically conductive member 205 having a sheet-like form is applied onto the solder paste 204 on the high-voltage depletion-mode transistor 201 and onto the low-voltage enhancement-mode transistor 203, and an assembly 206 is formed. The assembly 206 is heat-treated as is schematically illustrated by arrows 207, and an electrical connection is produced between the high-voltage depletion-mode transistor 201 and the low-voltage enhancement-mode transistor 203 by the electrically conductive member 205.

A solder paste may include particles of a solder in a liquid or paste-like matrix. The solder paste may be applied to the various components of the assembly at room temperature and all of the solder connections may be formed in a single subsequent heat treatment. During this heat treatment, the solder particle of the solder paste melt and the remaining components of the paste may evaporate. Should further connections be required to complete a circuit, for example bond wire connections, these may be formed after the heat treatment. Further rinsing and drying steps to remove unwanted components of the solder paste remaining after the heat treatment may also be carried out.

Figure 13:
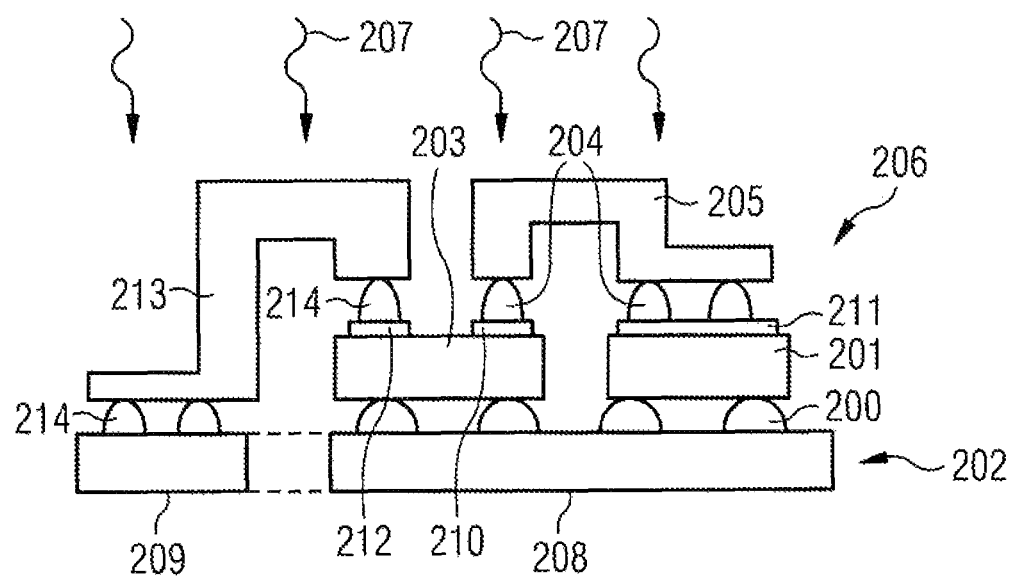
FIG. 13 illustrates a method for manufacturing an electronic component.

FIG. 13 illustrates a method in which the lead frame 202 may include a die pad 208 and two or more leads 209. The solder paste 200 which is applied to the lead frame 202 may be applied in predetermined discrete regions at the positions of the lead frame 202, typically the die pad 208, on which the low-voltage enhancement-mode transistor 203 and high-voltage depletion-mode transistor 201 are to be mounted.

The solder paste 204 may be applied to the first current electrode 210 of the high-voltage depletion-mode transistor 201 and to the first current electrode 211 of the low-voltage enhancement-mode transistor 203. The electrically conductive member 205 may be applied to the solder paste 204 positioned on the first current electrode of the high-voltage depletion-mode transistor 201 and to the solder positioned on the first current electrode of the low-voltage enhancement-mode transistor 203.

The high-voltage depletion-mode transistor 201 may be a gallium nitride-based HEMT including a source electrode, providing the first current electrode, a drain electrode and a gate electrode. The low-voltage enhancement-mode transistor 203 may be a p-type MOSFET device including a source electrode, providing first current electrode, a drain electrode and a gate electrode.

The low-voltage enhancement-mode transistor 203 may be an n-type MOSFET device including a drain electrode, which provides first current electrode, a source electrode and a gate electrode. In embodiments in which the MOSFET device has a vertical drift path, the source electrode and the gate electrode may be provided on a first surface and the drain electrode provided on a second surface, which opposes the first surface.

In embodiments in which the second current electrode 212, for example the drain electrode, of the high-voltage depletion-mode transistor 201 is electrically coupled to a drain lead 209 of the package by a second contact clip 213, solder paste 214 may be applied to the second current electrode 212 and the drain lead 209, the contact clip 213 applied to the solder paste 214 positioned on the second current electrode 212 and the drain lead 209 before the heat treating is carried out. Therefore, the second contact clip 213 forms part of the assembly. The application of the solder paste and stacking of these components may be carried out at room temperature.

The use of solder paste enables the physical assembly of the two transistors and contact clips on the lead frame to be carried out at room temperature and a single heat treatment step to be used to produce all of the electrical connections between the contact clips to their respective electrode or lead and to mount the two transistors and, in the case of the low-voltage enhancement-mode transistor, also electrically couple, to the die pad, in a single heat treatment.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", an and the are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   applying solder paste to at least one electrically conductive portion of a package;
   applying a high-voltage depletion-mode transistor onto the solder paste;
   applying a low-voltage enhancement-mode transistor onto the solder paste;
   applying solder paste onto the high-voltage depletion-mode transistor;
   applying solder paste onto the low-voltage enhancement-mode transistor;
   applying an electrically conductive member onto the solder paste on the high-voltage depletion-mode transistor and onto the solder paste on the low-voltage enhancement-mode transistor to form an assembly; and
   heat treating the assembly to produce an electrical connection between the high-voltage depletion-mode transistor and the low-voltage enhancement-mode transistor via the electrically conductive member.

2. The method of claim 1, wherein solder paste is applied to a first current electrode of the high-voltage depletion-mode transistor and to a first current electrode of the low-voltage enhancement-mode transistor and the electrically conductive member is applied to the first current electrode of the high-voltage depletion-mode transistor and to the first current electrode of the low-voltage enhancement-mode transistor.

3. The method of claim 2,
   wherein the high-voltage depletion-mode transistor comprises a first side comprising the first current electrode, a second current electrode and a control electrode,
   wherein the low-voltage enhancement-mode transistor comprises a first side comprising a second current electrode and a control electrode and a second side opposing the first side, the second side comprising the first current electrode of the low-voltage enhancement-mode transistor,
   wherein the electrically conductive member extends between the first current electrode of the high-voltage depletion-mode transistor and the first current electrode of the low-voltage enhancement-mode transistor, and
   wherein the second current electrode of the low-voltage enhancement-mode transistor is mounted on a die pad and the control electrode of the low-voltage enhancement-mode transistor is mounted on a lead spaced at a distance from the die pad.

4. The method of claim 1, wherein solder paste is applied to a second current electrode of the high-voltage depletion-mode transistor and to a further electrically conductive portion of the package.

5. The method of claim 4, further comprising applying a second electrically conductive member onto the second current electrode of the high-voltage depletion-mode transistor and the further electrically conductive portion of the package to produce an electrical connection between the high-voltage depletion-mode transistor and the further electrically conductive portion of the package with the second electrically conductive member.

6. The method of claim 1, wherein the low-voltage enhancement-mode transistor has a vertical drift path.

* * * * *